United States Patent [19]

Suzuki et al.

[11] Patent Number: 5,133,603
[45] Date of Patent: Jul. 28, 1992

[54] DEVICE FOR OBSERVING ALIGNMENT MARKS ON A MASK AND WAFER

[75] Inventors: Akiyoshi Suzuki, Tokyo; Hideki Ina, Kawasaki, both of Japan

[73] Assignee: Canon Kabushiki Kaisha, Tokyo, Japan

[21] Appl. No.: 735,692

[22] Filed: Jul. 23, 1991

Related U.S. Application Data

[63] Continuation of Ser. No. 422,548, Oct. 17, 1989, abandoned.

[30] Foreign Application Priority Data

Oct. 18, 1988 [JP] Japan .................. 63-263691

[51] Int. Cl.$^5$ .................................. G01B 9/02
[52] U.S. Cl. .................... 356/400; 356/401; 355/45; 359/386
[58] Field of Search ........... 356/400, 401; 355/43, 355/45; 350/524, 399

[56] References Cited

U.S. PATENT DOCUMENTS

| | | | |
|---|---|---|---|
| 3,853,398 | 12/1974 | Kano | 355/45 |
| 4,389,084 | 6/1983 | Ban et al. | 350/524 |
| 4,406,546 | 9/1983 | Suzuki | 356/400 |
| 4,634,240 | 1/1987 | Suzuki et al. | |
| 4,645,924 | 2/1987 | Suzuki et al. | |
| 4,655,601 | 4/1987 | Suzuki | |

FOREIGN PATENT DOCUMENTS

| | | |
|---|---|---|
| 60-261138 | 12/1985 | Japan . |
| 1-191418 | 8/1989 | Japan . |
| 1-191419 | 8/1989 | Japan . |

*Primary Examiner*—Samuel A. Turner
*Attorney, Agent, or Firm*—Fitzpatrick, Cella, Harper & Scinto

[57] ABSTRACT

An observation device for use in observation of a first object and a second object onto which a pattern of the first object is to be projected, the observation device includes a light source; a polarization beam splitter provided between the light source and the first object, for receiving light from the light source and for directing the same to the first and second objects; a first phase converting element provided between the first and second objects, for changing the state of polarization of the light from the light source as incident on the first phase converting element; and a second phase converting element provided to be disposed or to be selectively disposed between the first object and the polarization beam splitter, for changing the state of polarization of reflection light from the first object as incident on the second phase converting element; wherein the first and second objects can be observed by detecting, through the polarization beam splitter, reflection light reflected by the second object ane passing through the first object or by detecting the reflection light and reflection light from the first object.

31 Claims, 5 Drawing Sheets

DEVICE FOR OBSERVING ALIGNMENT MARKS ON A MASK AND WAFER

This application is a continuation of application Ser. No. 07/422,548 filed Oct. 17, 1989, now abandoned.

FIELD OF THE INVENTION AND RELATED ARTS

This invention relates to an observation device for use in observation of two objects and, more particularly, to an observation device suitably usable, in a semiconductor exposure apparatus, for observation of alignment marks of a mask and a wafer for aligning them with each other.

As an observation device for use in a semiconductor device manufacturing exposure apparatus, one such as disclosed in U.S. Pat. No. 4,406,546 is well known in the art. One problem that arises in observing a wafer through a mask is due to the effect of reflection light from a glass surface of the mask. Where the glass surface of the mask is not treated with an anti-reflection treatment, about 4% of light is reflected from each glass surface. Therefore, from the front side and back side, about 8% of the light is reflected from the mask and such reflection light is mixed and produces a flare with reflection light from the wafer.

The aforementioned U.S. Pat. No. 4,406,546 discloses a device which, for solving such problem, is arranged so that when a mask and a wafer are observed by using reflection light from the wafer the effect of reflection light from the mask is avoided.

FIG. 1 is a schematic view of this type of observation, device. In the device of FIG. 1, for observation any reflection light from the mask is intercepted by a polarization device. As a result, the mask can be observed only with use of reflection light from the wafer. Light L1 from an unshown light source passes through a polarization beam splitter 5 and is transformed into a P-polarized light which illuminates a mask 1 having an alignment mark formed thereon. Here, the light L1 may be such light whose direction of polarization corresponds to the polarizing direction of the polarization beam splitter or, alternatively, it may be a non-polarized light. Reflection light L2 from the mask 1 enters again the polarization beam splitter 15. This reflection light L2 is a P-polarized light with respect to which the polarization beam splitter shows transmissibility. As a result, the reflection light L2 passes through the polarization beam splitter 15 and goes backwardly along its oncoming path. Quarter waveplate 23 isprovided in a projection optical system 22, and light L3 which passes through the mask 1, the projection optical system 22 and the quarter waveplate 23 is transformed into a circularly polarized light that illuminates a wafer 2 having an alignment mark formed thereon. Light L4 reflected by the wafer 2 passes again through the quarter waveplate 23 and it is transformed into a rectilinearly polarized light (S-polarized light) having its direction of polarization rotated by 90 degrees with respect to the direction of polarization as the light is first incident on the quarter waveplate. After passing through the mask 1, the light enters the polarization beam splitter 15. Accordingly, the light having impinged on the wafer 2 is now reflected by the polarization beam splitter 15, and it is received by a naked eye 53 or, alternatively, by an image pickup device, for example, as an observation light L5 for observation of the relative position of the alignment marks of the mask 1 and the wafer 2. In this manner, the mark of the mask 1 is illuminated only by the reflection light from the wafer.

On the other hand, an observation device which does not utilize polarization and which does not include any polarization optical element such as a polarization beam splitter, involves the following problems such as:

The first problem is concerned with the quantity of light. Where any polarization beam splitter is not used but a half mirror is used, the efficiency of light utilization is highest when both the transmission factor and the reflection factor are 50% and, at this time, the efficiency of utilization of the observation light is 25%. On the other hand, where a polarization beam splitter is used, the efficiency of the observation light passing through the polarization beam splitter is 100%, provided that the orientation of the crystal axis of the quarter waveplate is set correctly. As regards the efficiency when the light first passes a polarization beam splitter, it is 50% where an incident light impinging on the beam splitter is non-polarized light but it is 100% where a polarization type laser is used and provided that the direction of polarization of a laser beam exactly agrees to the polarizing direction of the polarization beam splitter. Namely, without use of polarization, the efficiency of light utilization reduced to $\frac{1}{2}$-174 or less. This is disadvantageous, particularly when a mask and a wafer are to be detected photoelectrically.

A second problem is concerned with signal processing in regard to contrast of an image of a wafer and of an image of a mask at the time of such photoelectric detection. More specifically, if the reflection factor of a wafer 2 is low, reflection light from chromium of a reticle 1 is detected with high intensity, resulting in difficulty in detection of the wafer. FIG. 2 exemplifies signal outputs corresponding to the mask image and the wafer image, in cases where polarization is utilized and is not utilized. If, as shown in part (a) of FIG. 2, an alignment mark 9 of a wafer is positioned between chromium portions 7 (alignment mark) of a mask, output signals obtainable along a scan line 10 when these marks are observed through image pickup by using a CCD camera, are such as illustrated in parts (b) and (c) of FIG. 2. Part (b) of FIG. 2 corresponds to a case where polarization is utilized as described with reference to FIG. 1 and, in this case, a signal output 7' corresponding to the chromium portions 7 of the mask is lower than a signal output 107' corresponding to such portion of the wafer having no mark. This is because the reflection light from the mask is not directly received, whereas the mask is illuminated by the reflection light from the wafer. On the other hand, part (c) of FIG. 2 corresponds to a case where polarization is not utilized and, in this case, intense reflection light from the chromium portions 7 of the mask is directly received. As a result, a signal output 7" corresponding to the chromium portions 7 has a high level. As compared therewith, in regard to a signal corresponding to the mark 9 of the wafer, because of the low reflection factor of the wafer and, additionally, due to the effect of the reflection light from the glass surface of the mask, the contrast is low. Accordingly, if the polarization is not utilized, the difference between these signal outputs becomes too large. On the other hand, in consideration of the possibility of adjustment of the quantity of inputted light to optimize the output level of the signal from the CCD camera, where polarization is utilized, the light adjustment may be made in regard to the signal output 107' (FIG. 2, part (b)) corresponding to the wafer. However, as for the output shown in FIG. 2, part (c), wherein no polarization is used, the light adjustment has to be made in regard to the output 7″ corresponding to the chromium portions of the reticle. This is not suitable for detection of the alignment mark of the wafer.

As described hereinbefore, use of polarization for observation of a mask and a wafer has a large advantage as compared with a case where the polarization is not used. However, because the observation is made of the mask which is illuminated with the reflection light from the wafer, there arises a problem of failure in detection of a signal output corresponding to the mask if a signal output 107′ corresponding to the wafer is low.

FIG. 3 illustrates a wafer surface 113 which is coated with a photoresist 114. In the neighborhood of a wafer alignment mark 116 which is provided for alignment purpose, due to the effect of the step (height) of the mark, the thickness of a corresponding portion 117 of the photoresist changes. Generally, the reflection factor of a wafer changes with the thickness of a resist 114. If the resist thickness $T_{PR}$ is equal to ¼ of the wavelength of the inputted light, then reflection light 118 from the resist surface and reflection light 119 from the wafer surface interfere with each other, resulting in a decrease in intensity of the reflection light from the wafer. If the wavelength of the inputted light is denoted by λ and the refractive index of the resist 114 is denoted by N, then the intensity of the reflection light decreases when the relationship such as follows is satisfied:

$$T_{PR} = (m \pm \tfrac{1}{4})\lambda/N$$

(where m is an integral number) The worst is a case where the reflection light 118 from the resist is equal in intensity to the reflection light 119 from the wafer surface and, in such case, any output corresponding to reflection light is not obtainable. If occasionally, a portion of the wafer at the site corresponding to the alignment mark of the mask satisfies the condition mentioned just above, any signal corresponding to the alignment mark of the mask can not be detected. On the other hand, as regard the part of the resist 117 covering the alignment mark 116 of the wafer, the thickness of the resist changes in the neighborhood of the step of the mark and, therefore, the interference condition changes. This leads to a change in the intensity of the reflection light and, for this reason and also because of the scattering of the light at an edge of the mark, the result is that the mask can not be detected whereas only the wafer can be detected. As described above, there arises a problem that the mask can not be detected though the wafer can be detected. Particularly, while a wafer is very sensitive to the effect of a process and also there is a large problem in regard to the detecting precision, a mask is a subject of detection which comprises a glass substrate that is substantially idealistically patterned with chromium, and therefore, it is a critical problem that such a mask can not be detected.

SUMMARY OF THE INVENTION

It is accordingly an object of the present invention to provide an observation device through which two objects can be observed substantially without exception.

In accordance with an aspect of the present invention, to achieve this object, there is provided an observation device which comprises a light source; a polarization dividing means provided between the light source and a first object; and a first phase converting element provided between the first object and a second object on which a pattern of the first object is to be projected; wherein the light from the light source is directed through the polarization dividing means to the first and second object; wherein reflection light from the second object is selectively extracted through the first phase converting element and the polarization dividing means and, by using the extracted reflection light, the first and second objects are observed; and wherein the observation device further comprises a second phase converting element which is disposed or, alternatively, is provided to be disposed in the path of light between the polarization dividing means and the first object.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 4:
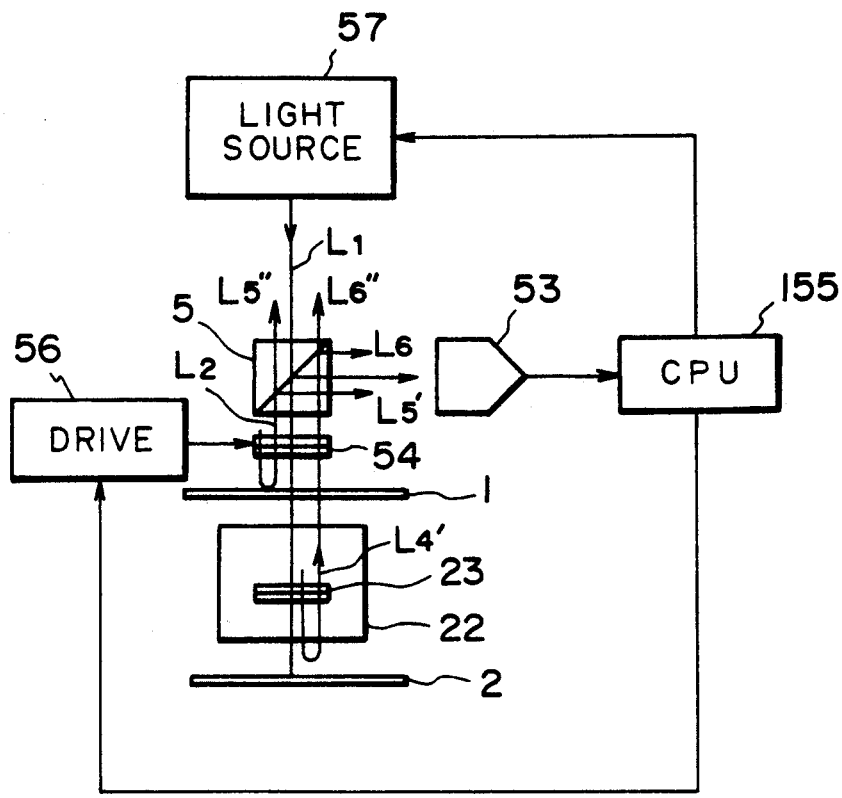
FIG. 4 is a schematic view, showing the fundamental principle of the present invention.

Referring now to FIG. 4 which illustrates the fundamental principle of an observation device according to the present invention, an important difference of the illustrated observation device to the known type device having been described with reference to FIG. 1 resides in that an additional quarter waveplate 54 (second phase converting element) is provided between a polarization beam splitter 5 (polarization dividing means) and a mask 1 (first object).

Figure 1:
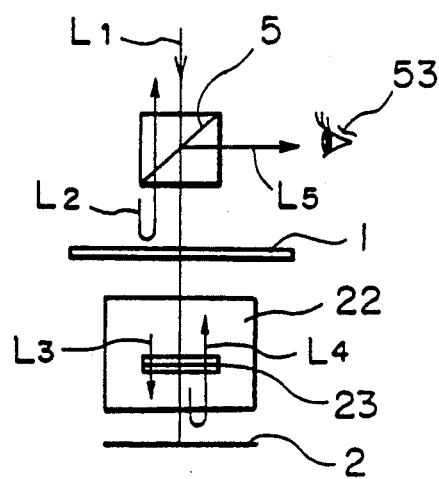
FIG. 1 is a schematic view of a known type observation device.

Following the light, like the case of FIG. 1, inputted light L1 from a light source 57, which comprises a P-polarized light, passes a polarization beam splitter 5 and then enters the quarter waveplate 54 still in the form of a rectilinearly polarized light (P-polarized light). If the set angle of this quarter waveplate 54 (i.e. the angle defined between the direction of polarization of the inputted light and the crystal axis of the quarter waveplate 54) is 0°, the quarter waveplate 54 does not provide any action to the inputted light, like the case of the known example. If on the other hand, the set angle is changed from 0°, light L2' reflected from the mask 1 does include not only light L5" which goes through the polarization beam 15 splitter 5 but also light L5' which is reflected by the beam splitter. If the set angle of the quarter waveplate 54 is denoted by θ, the light passing twice through the quarter waveplate 54 comes to be a rectilinearly polarized light having a direction of polarization different, by 2θ, from the direction of polarization as assumed before the light is first inputted. Therefore, if θ=0°, the quarter waveplate 54 does not act on the inputted light. On the other hand, if θ has a certain value (θ>0), the light passing through the quarter waveplate does include light of polarized component that can be reflected by the polarization beam splitter 5. If the set angle is 45°, no transmission light L5" is produced and all the light is reflected as reflection light L5'. Details of this will be explained with reference to FIGS. 5A and 5B.

Figure 5A:
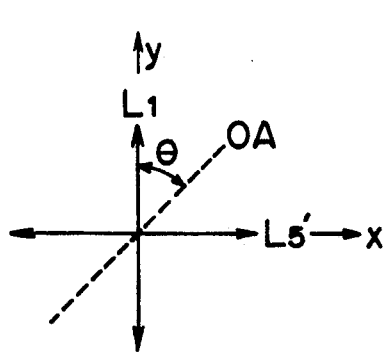
FIGS. 5A and 5B illustrate the relationship between the orientation of a crystal axis of a quarter waveplate and the direction of polarization of an inputted light.
Figure 5B:
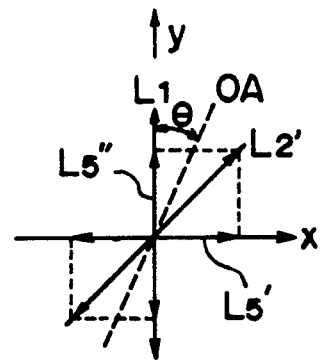
Figure 6A:
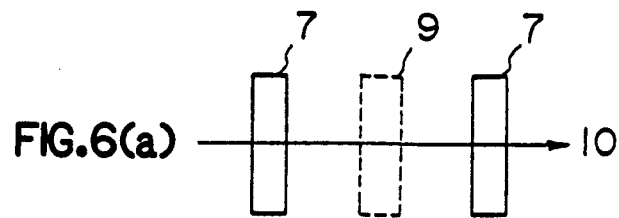
FIG. 6a–f is a representation, illustrating the change in the output signal from a CCD camera in the observation device shown in FIG. 6.
Figure 6B:
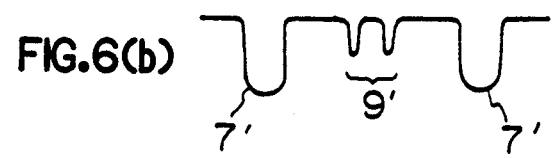
Figure 6C:
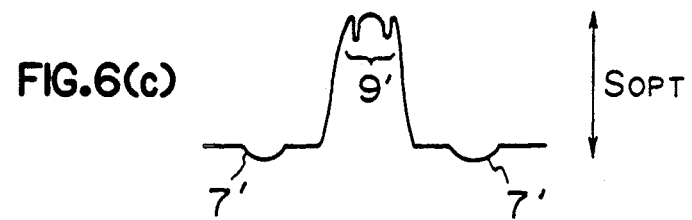
Figure 6D:
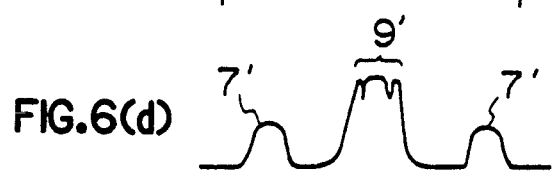
Figure 6E:
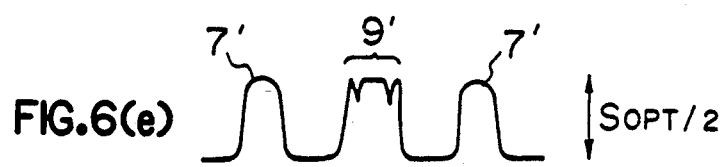
Figure 6F:
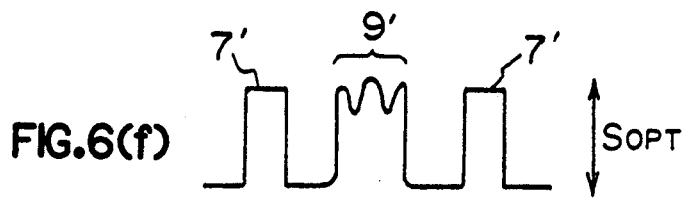

FIGS. 5A and 5B show the relationship between the direction of polarization of an inputted light L1 and the crystal axis OA of a quarter waveplate and a reflection light L5'. FIG. 5A corresponds to a case where the set angle θ of the quarter waveplate 54 is equal to 45°, and, in this example, if the inputted light L1 passes twice the quarter waveplate 54, then the direction of polarization thereof changes twice the set angle θ, namely, by 2θ=90°. In other words, in a state in which the plane of polarization is rotated by 90° from the inputted light L1 (i.e. in the S-polarized state), the reflected light from the mask 1 enters the polarization beam splitter 5. While the polarization beam splitter 5 has a property of transmitting light which is in the direction of polarization of the inputted light L1 (P-polarization), it has a function for reflecting light directly reflected from the mask 1 (S-polarized light). Therefore, all the reflection light from the mask 1 can be received. On the other hand, the light passing through the mask 1 at this time comprises a circularly polarized light, and it passes through a quarter waveplate 23 provided in a projection lens system 22. Here, the quarter waveplate 23 has a set angle θ of 45° with respect to the inputted light L1. As a result, if the set angle of the quarter waveplate 54 is defined such as illustrated in FIG. 5A, the two quarter waveplates 23 and 54 have their crystal axes OA oriented in the same direction. Consequently, as a wafer 2 (second object) is illuminated, the light is in the form of a polarized light (P-polarized light) the same as the inputted light L1 or, alternatively, in the form of a polarized light (S-polarized light) having its plane of polarization rotated by 90°. Reflection light reflected from the wafer 2 again goes through the two quarter waveplates 23 and 54 and, by this, finally it is transformed into a P-polarized light having the same direction of polarization as the inputted light L1. As a result of this, because of the direction of polarization, the light impinging on the wafer 2 comprises such a light L6" that can be transmitted through the polarization beam splitter 5 and, therefore, the quantity of such light (L6') to be reflected by the polarization beam splitter 5 comes to be zero. Accordingly, a light receiving element 53 receives only the reflection light L5' from the mask 1 but does not receive any reflection light L6' from the wafer 2. If, on the other hand, the quarter waveplate 54 has a set angle θ of 22.5° as in the case of FIG. 5B, the direction of polarization of reflection light L2' from the mask 1 changes by 2θ=45° with respect to the direction of polarization of the inputted light L1. Of the reflection light from the mask 1, the light L5' which is to be reflected by the polarization beam splitter 5 has an intensity that corresponds to the component of a vector defined when a vector representing the reflection light L2' in the drawing is projected onto the x axis. Similarly, light L5" transmitted through the polarization beam splitter 5 has an intensity that corresponds to the component of a vector defined as a vector representing the reflection light L2" is projected onto the y axis. Accordingly, if the set angle of the quarter waveplate 54 is denoted by θ, the reflection light from the mask 1 has its plane of polarization rotated by 2b and, therefore, light L5" passing through the polarization beam splitter 5 has a quantity that can be represented by "$\cos^2 2\theta$" where the quantity of the inputted light L1 is taken as "1". Similarly, the quantity of the light L5' reflected by the polarization beam splitter 5 can be represented by "$\sin^2 2\theta$".

It is seen from the foregoing that, by rotationally displacing the quarter waveplate 54 about the optical axis, the intensity of the light component L5' of the reflection light from the mask 1 can be adjusted to an optimum.

Although masks 1 have a substantially constant reflection factor, due to the difference in process for IC manufacture, wafers 2 may have various or unconstant reflection factors. For this reason, in order to ensure that light of a constant quantity is obtained from a mask 1 and a wafer 2, light control is required such that an intense light is supplied where a wafer 2 has a low reflection factor and a weak light is supplied where a wafer 2 has a high reflection factor.

Figure 2A:
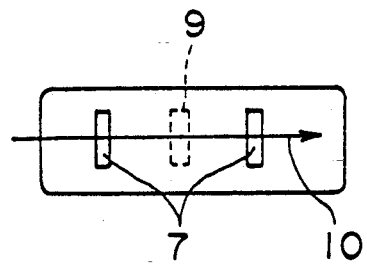
FIG. 2a–c is a representation, illustrating the difference between output signals of a CCD camera in the case where it is used in the device of FIG. 1 and where it is used in a device that does not use polarization.
Figure 2B:
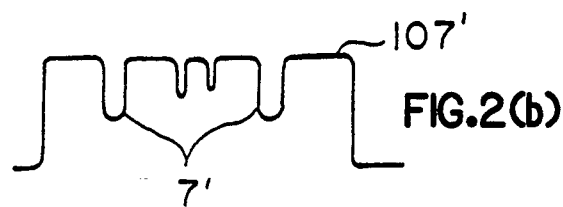
Figure 2C:
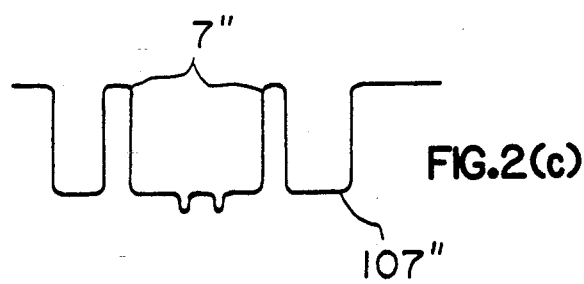

In an example where polarization is not utilized, as in the example of the signal depicted in part (c) of FIG. 2, it is not possible to perform suitable light control to a wafer 2 without adversely affecting a mask signal. However, if a quarter waveplate 54 (phase converting element) is provided and the set angle θ of this quarter waveplate is adjusted to execute the light control, as in the present invention, light of a certain intensity can be independently obtained from a mask and, therefore, it is possible to attain the very light control, increasing the level of a wafer signal without adversely affecting a mask signal.

FIG. 6 illustrates signals as obtainable when images of alignment marks of a mask and a wafer are picked up by using the device of FIG. 4.

FIG. 6, part (a), corresponds to FIG. 2, part (a), and shows the state of images of alignment marks 7 and 9 of a mask 1 and a wafer 2. FIG. 6, part (b) corresponds to a case where a wafer 2 has a high reflection factor, which is an occasion where each output 7' corresponding to alignment mark 7 of a mask 1 has sufficient contrast. FIG. 6, part (c), corresponds to a critical case where a wafer 2 has a low reflection factor and, in this case, while edges of a signal corresponding to an alignment mark of a wafer 2 may be detected, due to the low reflection factor of the wafer 2 each signal 7' corresponding to an alignment mark of a mask has low contrast. If in this case the quarter waveplate 54 shown in FIG. 4 is rotationally displaced by a predetermined amount, it becomes possible to detect signals 7' of the alignment marks of the mask 1 with good contrast, as depicted in FIG. 6, part (d). Further rotational displacement of the quarter waveplate 54 may cause further increase in the level of each signal 7' of the mask alignment mark, as depicted in FIG. 6, part (e). Here, the level of the signal 9' corresponding to the wafer alignment mark may decrease relatively. However, by increasing the strength of an inputted light to the wafer, it is possible to obtain those signals such as depicted at 7' and 9' in FIG. 6, part (f).

As described hereinbefore, it is an important feature of the present invention that: the state of a signal corresponding to an alignment mark of a wafer as well as the state (level) of a signal corresponding to an alignment mark of a mask are monitored and the state (direction of the crystal axis) of the quarter waveplate 54 is controlled appropriately, by which both the signal of the mask (reticle) alignment mark and the signal of the wafer alignment mark can be rendered into those each of a level that can be processed conveniently.

Here, the word "state" of the quarter waveplate is used to depict any action such as, for example, rotating the quarter waveplate 54 or introducing/retracting it into/from the light path. In the present invention, many varieties of forms are included.

Figure 3:
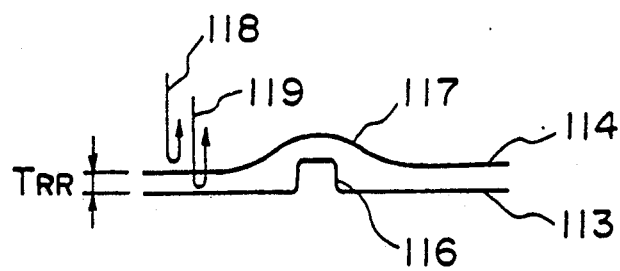
FIG. 3 is a representation, illustrating the effect of interference resulting from a photoresist applied to a wafer.

As an example, where a wafer 2 is coated with an absorption type resist so that the reflection factor of the wafer 2 is low, in many cases there is a possibility of difficulty in detection an alignment mark signal of a mask. As regards an alignment mark signal for such a wafer 2, it may be detected due to a slight change in film thickness in the neighborhood of an alignment mark 116 such as illustrated in FIG. 3. However, as regards the alignment mark signal of a mask, in many cases there is a difficulty in detection of the same because of the combination of absorption and interference of optical energy due to the presence of the resist 114. In such a case, the use of a quarter waveplate 54 in the light path between the polarization beam splitter 5 and the mask 1, as in the present invention, is particularly effective and provided that the process of such a wafer is stable and once the quarter waveplate 54 is inserted into the light path with the orientation of its crystal axis is maintained fixed, a sufficient effect can be obtained. As a matter of course, where the invention is applied to a reduction projection optical apparatus such as a stepper, for example, the angle of the quarter waveplate 54 may be controlled for each shot on the basis of a mark detection signal, as has been described with reference to FIG. 6.

For such control of the signals corresponding to a wafer and a reticle (mask), the device shown in FIG. 4 is equipped with a central processing unit (CPU) 155 having a signal discriminating function, and a driving system 56 for the quarter waveplate 54 and, additionally, the light source 57 is provided with a light quantity controller.

As illustrated in the drawing, the driving system 56, the image pickup device (CCD camera) 53 and the light source 57 are all electrically communicated with the CPU 155, and in accordance with the level or contrast of a video signal from the image pickup device 53 the CPU 155 controls the driving system 56 and the light quantity controller of the light source 57, while on the other hand by means of the driving system 56 the rotational angle of the polarizing plate 54 is adjusted and by means of the light quantity controller the strength of light from the light source 57 is adjusted.

Particularly, in a case of stepper, under the influence of a separate prealignment system a wafer is fed to a predetermined site with a precision of an order of ± a few microns. Accordingly, by restricting the picture field of the image pickup device 53 and then by executing the signal processing, it is easy to perform the control of output signals in the manner as described with reference to FIG. 6.

In the present invention, as described hereinbefore, the property of polarized light is utilized. On the other hand, the present invention is applicable also to a case where, in place of the quarter waveplate 23 in the projection lens system 22, a reflection film (phase converting element) having a specific phase characteristic is used (usually, this may be applied to a projection mirror system). Also, the invention is applicable to various types of exposure apparatus an example of which is a semiconductor device manufacturing exposure apparatus of proximity type.

Figure 7:
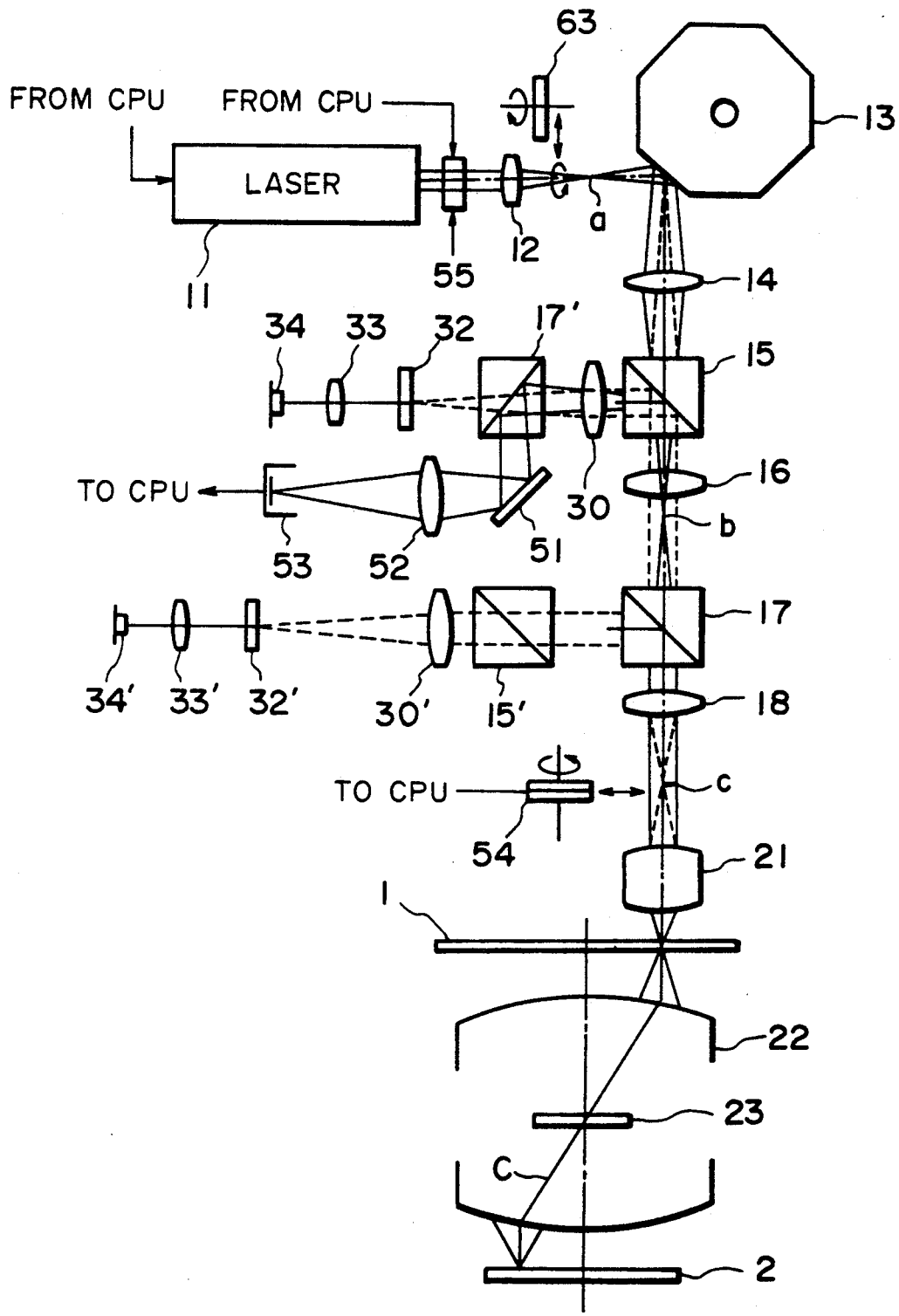
FIG. 7 is a schematic view of an alignment mark detecting optical system which is an embodiment of the observation device according to the present invention.

FIG. 7 shows an example wherein the device of FIG. 4 is used with a laser scanning optical system. Polarized laser beam emanating from a laser 11 is deflected by a polygonal mirror 13 so that, under the influence of an f-$\theta$ lens 14, it is scanned at a constant speed. After passing through a polarization beam splitter 15, a field lens 16, a beam splitter 17 and a relay lens 18, it is transformed by an objective lens 21 into a light beam focused on a reticle 1, such that the reticle 1 is scanned with the focused beam. The beam splitter 17 comprises a half mirror prism having substantially no polarizing characteristic and being adapted to transmit 80-90% of the received laser beam.

The laser beam passing through the reticle 1 goes through a quarter waveplate 23 disposed in a projection lens system 22 and is reflected by a wafer 2. After this, the light passes again the quarter waveplate 23 and the direction of polarization thereof is changed by 90°. As a result of this, the reflection light from the wafer 2, after passing the lenses 22, 21, 18 and 16 and passing the beam splitter 17, is reflected by the polarization beam splitter 15. The light reflected by the polarization beam splitter 15 goes through a lens 30 and another beam splitter 17 toward a spatial filter 32 for dark-field observation, which is provided at a position optically conjugate with a pupil plane of the projection lens system 22. Under the influence of this spatial filter 32, only the scattered light component is directed to a light receiving element 34 through a lens 33, and this component is received by the light receiving element 34 as a dark-field signal.

The laser beam directly reflected by the reticle 1 is separated by the beam splitter 17 into a light reflected thereby and a light transmitted therethrough. The light reflected by the beam splitter 17 goes through another polarization beam splitter 15' and, by way of a lens 30', it is directed to a spatial filter 32' which is provided at a position optically conjugate with the pupil plane of the projection lens system 22. Under the influence of the spatial filter 32', only the scattered light component is directed through a lens 33' to a light receiving element 34', such that it is received by the light receiving element 34' as a dark-field signal.

Next, a description will be provided of the image pickup for images of alignment marks of the reticle 1 and the wafer 2 by use of an image pickup device 53. As contrasted to the laser beam scanning described hereinbefore, as an illumination light, a light of large spot diameter is projected to the reticle 1 and the wafer 2. To attain this, a diffusing plate 63 is inserted before the polygonal mirror 13. As a matter of course, the diffusing plate 63 is retracted at the time of the laser beam scanning as described, so as not to block the path of the scanning laser beam. The diffusing plate 63 is rotationally displaced about the optical axis of the optical system or, alternatively, about an axis which is parallel to that optical axis. This is effective to substantially avoid formation of a speckle pattern which otherwise might be produced in a direction perpendicular to the scan direction on the reticle 1 with a diameter-enlarged beam spot by the polygonal mirror 13. When the quarter waveplate 54 is not inserted between the polarization beam splitter 15 and the reticle 1, like the case of FIG. 1 only the reflection light from the wafer 2 is reflected by the polarization beam splitter 15, and the light reflected by the polarization beam splitter 15 enters the beam splitter 17, whereby at this beam splitter 17 a portion of the light is reflected toward the image pickup device 53.

When the image pickup device 53 is used for observation of the reticle 1 and the wafer 2, the rotatable diffusing plate 63 is inserted and, for this reason, the function of the light receiving element 34 for detection of a dark-field signal is not used. Therefore, the beam splitter 17 may conveniently be replaced by a swingable mirror for enhanced efficiency of light utilization. The light reflected by the beam splitter 17 goes by way of a reflection mirror 51 and an erector 52 to form the images of the alignment marks of the mask and the wafer on the light receiving surface of the image pickup device 53. Here, in addition to the optical arrangement of the known example, a quarter waveplate 54 is provided which is rotationally displaced and stopped so as to determine an optimum set angle corresponding to the reflection factor of the wafer 2. If, in this case, it is necessary to change the quantity of illumination light provided by the laser 11, a light control system 55 disposed in the path of the laser beam emanating from the laser 11 is used to change the strength thereof. There are many varieties of adjustment of the quantity of illumination light and, if a semiconductor laser is used as a light source, an exciting electric current to the laser may be changed. Alternatively, some different ND filters may be prepared and selectively introduced into the path of the laser beam. Further, a polarizing plate may be provided and rotationally displaced in the path of light or, alternatively, the intensity may be modulated by using an acousto-optic element or an electro-optic element, for example.

As illustrated in FIG. 7, the observation device according to the present invention can be applied to various optical arrangements for observing two objects by using polarization.

Figure 8:
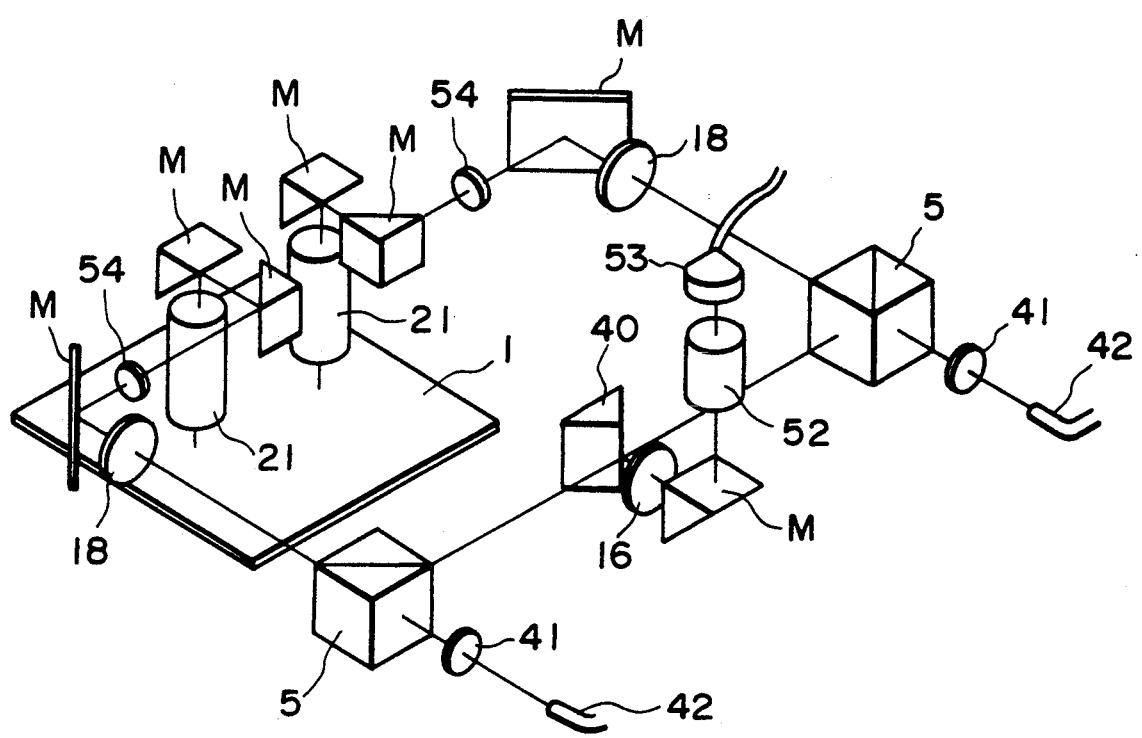
FIG. 8 is a perspective view of an alignment mark detecting optical system which is another embodiment of the observation device of the present invention.

FIG. 8 illustrates a further embodiment of the present invention which is an example where an ordinary light source is used in place of a laser. More specifically, FIG. 8 is a perspective view of an alignment optical system as viewed obliquely from the above, and the illustrated is a part of the alignment optical system which is located above a reticle 1. The part of the alignment optical system which is below the reticle 1 has the same structure as of the corresponding part of the FIG. 7 device. Also, those elements having corresponding functions as of the elements shown in FIG. 7 are denoted by like numerals.

In this example, the alignment optical system is arranged so as to allow observation of two, left and right alignment marks of the reticle 1 and, by means of a field combining prism 40, two fields corresponding to the two alignment marks are combined. Denoted at M are mirrors each being adapted to bend the optical axis in the optical arrangement. For such means, there are many varieties of forms, in addition to the disclosed one. Light source comprises fibers 42 and those denoted at 41 are condenser lenses of an illumination system. To another end face of each fiber 42, light from an unshown light source is directed. Each polarization beam splitter 5 has a function similar to that of the one shown in FIG. 4 or 7, and the rotational angle $\theta$ of each quarter waveplate 54 is controlled on the basis of an output of the image pickup device 53.

In the present embodiment, as described hereinbefore, a phase converting element such as a quarter waveplate, for example, is added to an optical arrangement of the known type observation device and the set angle $\theta$ of the phase converting element is controlled in a specific way. By this, both the signals corresponding to first and second objects, such as a mask (reticle) and a wafer, can be detected with a good signal-to-noise ratio.

While the invention has been described with reference to the structures disclosed herein, it is not confined to the details set forth and this application is intended to cover such modifications or changes as may come within the purposes of the improvements or the scope of the following claims.

What is claimed is:

1. An observation device for use in observation of first and second objects opposed to each other, said device comprising:
   a light source;
   a polarization beam splitter disposed between said light source and the first object, for receiving light from said light source and for directing at least a portion of the received light to the first and second objects;
   a first polarization member disposed on a light path between the first and second objects, for changing a state of polarization of received light; and
   a second polarization member disposed on a light path between said polarization beam splitter and the first object, for changing a state of polarization of received light;
   wherein, for observation of the first and second objects, first reflection light from the first object is detected through the action of said second polarization member and said polarization beam splitter, while second reflection light from the second object is detected through the action of said first polarization member, the first object, and second polarization member and said polarization beam splitter.

2. A device according to claim 1, wherein said first polarization member comprises a quarter waveplate.

3. A device according to claim 2, wherein said second polarization member comprises an optical crystal with a crystal axis, and wherein said second polarization member is rotatable to change the orientation of the crystal axis with respect to a plane of polarization of the first reflection light.

4. A device according to claim 3, further comprising image pickup means for receiving the first refection light and the second reflection light to observe images of the first and second objects, and adjusting means for rotating said second polarization member in accordance with a level of an output signal from said image pickup means to adjust the orientation of said crystal axis.

5. A device according to claim 4, further comprising modulating means for modulating the intensity of light from said light source in accordance with the level of the output signal from said image pickup means.

6. A device according to claim 1, wherein said light source comprises a laser which is equipped with an arrangement for substantially avoiding production of a speckle pattern on the first object with light from said laser.

7. A device according to claim 1, wherein said light source comprises an optical fiber and a condensing optical system for directing light from said fiber to said polarization beam splitter.

8. A device according to claim 1, wherein said light source provides rectilinearly polarized light and wherein said polarization beam splitter functions so that the direction of polarization of the light from said light source agrees to the polarizing direction of said polarization beam splitter.

9. A device according to claim 1, wherein said first polarization member has a reflection surface and serves to change the state of polarization of the received light by reflecting the received light with its reflection surface, while shifting a phase.

10. A device according to claim 1, wherein said second polarization member comprises a quarter waveplate.

11. A device according to claim 1, wherein the second polarization member is demountably supported on the light path.

12. An observation system for observing a mask and a wafer opposed to each other with a quarter waveplate interposed therebetween, said observation system comprising:
   a light source;
   a photodetector; and
   a detection optical system having a polarization beam splitter and an auxiliary quarter waveplate, wherein said polarization beam splitter is disposed between said light source and said auxiliary quarter waveplate, wherein said detection optical system serves to direct light from said light source of the mask and the wafer through the action of said polarization beam splitter and auxiliary quarter waveplate, serves to direct first reflection light from the mask to said photodector through the action of said auxiliary quarter waveplate and said polarization beam splitter, and serves to direct second reflection light from the wafer to said photodetector through the action of the mask, said auxiliary quarter waveplate, and said polarization beam splitter.

13. An observation system according to claim 12, wherein said auxiliary quarter waveplate is demountably mounted on said system.

14. An observation system according to claim 12, wherein said photodetector comprises an image pickup device and wherein, with the first and second reflection light, images of marks of the mask and the wafer are formed on said image pickup device.

15. An observation system according to claim 14, wherein said auxiliary quarter waveplate is rotatable about an optical axis of said detection optical system in accordance with a level of an output signal from said image pickup device.

16. An observation system according to claim 14, further comprising means for modulating the light from said light source in accordance with a level of an output signal from said image pickup device.

17. An observation system according to claim 15, further comprising means for modulating the light from said light source in accordance with the level of the output signal from said image pickup device.

18. An observation system according to claim 12, wherein said light source comprises an optical fiber for emitting the light.

19. An observation system according to claim 12, wherein said light source comprises a laser for emitting the light.

20. A projection exposure apparatus, comprising:
   a projection optical system for projecting an image of a pattern of mask upon a wafer, said projection optical system having a first quarter waveplate;
   a light source;
   an image pickup device;
   a detection optical system having a polarization beam splitter and a second quarter waveplate, wherein said polarization beam splitter is disposed between said light source and said second quarter waveplate, wherein said detection optical system serves to direct light from said light source to the mask and the wafer through the action of said polarization beam splitter and said second quarter waveplate, serves to direct first refection light from the mask to said image pickup device through the action of said second quarter waveplate and said polarization beam splitter, and serves to direct second reflection light from the wafer to said image pickup device through the action of the mask, said second quarter waveplate and said polarization beam splitter, whereby images of marks of the mask and the wafer are projected on said image pickup device; and
   a rotating mechanism for rotating said second quarter waveplate about an optical axis of said detection optical system.

21. An apparatus according to claim 20, wherein said second quarter waveplate is demountably mounted on said apparatus.

22. An apparatus according to claim 20, wherein said second quarter waveplate is rotatable in accordance with a level of an output signal from said image pickup device.

23. An apparatus according to claim 20, further comprising means for modulating the intensity of the light from said light source in accordance with a level of an output signal from said image pickup device.

24. An apparatus according to claim 20, wherein said first quarter waveplate comprises a reflection plate.

25. A method of observing marks of a mask and a wafer opposed to each other with a quarter waveplate interposed therebetween, said method comprising the steps of:
   illuminating the mask with polarized light to thereby illuminate the wafer through the action of the mask and the quarter waveplate;
   detecting reflection light, produced by the illumination of the wafer, through the action of the quarter waveplate and the mask and a polarization beam splitter; and
   changing the state of polarization of reflection light produced by the illuminated mask between the mask and the polarization beam splitter so that at least a portion of the reflection light from the mask is directed to a path of refection light produced by the wafer, such that the reflection light from the mask is used to detect the marks of the mask.

26. A method according to claim 25, further comprising the step of forming images of the marks of the mask and the wafer with reflection light from the mask and the reflection light from the wafer.

27. A method according to claim 26, further comprising the step of photoelectrically observing the marks of the mask and the wafer.

28. A method according to claim 27, wherein said changing step comprises the step of using a second quarter waveplate to change the stage of polarization.

29. A method according to claim 27, wherein said illuminating step comprises the step of illuminating the mask with modulatable light intensity.

30. A method according to claim 25, wherein said illuminating step comprises the step of illuminating the mask with the polarized light through the action of the polarization beam splitter.

31. A method according to claim 26, wherein said illuminating step comprises the step of illuminating the mask with the polarized light through the action of the polarization beam splitter.

* * * * *

UNITED STATES PATENT AND TRADEMARK OFFICE
CERTIFICATE OF CORRECTION

PATENT NO. : 5,133,603  
DATED : July 28, 1992  
INVENTOR(S) : AKIYOSHI SUZUKI, ET AL.

Page 1 of 3

It is certified that error appears in the above-identified patent and that said Letters Patent is hereby corrected as shown below:

On the Title page, item  
[57] ABSTRACT

Line 19, "ane" should read --and--.

COLUMN 1

Line 9, "ARTS" should read --ART--.

Line 33, "observation," should read --observation--.

Line 46, "splitter 15" should read --splitter 5--.

Line 50, "splitter 15" should read --splitter 5--.

Line 51, "isprovided" should read --is provided--.

Line 63, "splitter 15" should read --splitter 5--.

Line 65, "splitter 15" should read --splitter 5--.

COLUMN 2

Line 23, "to" should read --with--.

COLUMN 3

Line 33, "number)" should read --number).--

Line 41, "can not" should read --cannot--.

UNITED STATES PATENT AND TRADEMARK OFFICE
CERTIFICATE OF CORRECTION

PATENT NO. : 5,133,603
DATED : July 28, 1992
INVENTOR(S) : AKIYOSHI SUZUKI, ET AL.

It is certified that error appears in the above-identified patent and that said Letters Patent is hereby corrected as shown below:

Line 49, "can not" should read --cannot--.

Line 51, "can not" should read --cannot--.

Line 58, "can not" should read --cannot--.

COLUMN 5

Line 3, "15" should be deleted.

Line 65, "20=45°" should read --2θ=45°--.

COLUMN 6

Line 7, "is" should read --which is--.

Line 11, "2b" should read --2θ--.

COLUMN 7

Line 4, "that:" should read --that--.

COLUMN 10

Line 44, "and" should be deleted.

Line 56, "refection" should read --reflection--.

UNITED STATES PATENT AND TRADEMARK OFFICE
CERTIFICATE OF CORRECTION

PATENT NO. : 5,133,603
DATED : July 28, 1992
INVENTOR(S) : AKIYOSHI SUZUKI, ET AL.

It is certified that error appears in the above-identified patent and that said Letters Patent is hereby corrected as shown below:

<u>COLUMN 11</u>

Line 11, "to" should read --with--.

Line 39, "photodector" should read --photodetector--.

<u>COLUMN 12</u>

Line 6, "mask" should read --a mask--.

Line 18, "refection" should read --reflection--.

Line 59, "refection" should read --reflection--.

Signed and Sealed this

Seventh Day of September, 1993

Attest:

BRUCE LEHMAN

*Attesting Officer*   *Commissioner of Patents and Trademarks*